United States Patent [19]
Wanlass

[11] Patent Number: 5,020,028
[45] Date of Patent: May 28, 1991

[54] FOUR TRANSISTOR STATIC RAM CELL

[75] Inventor: Frank Wanlass, Cupertino, Calif.

[73] Assignee: Standard Microsystems Corporation, Hauppauge, N.Y.

[21] Appl. No.: 390,086

[22] Filed: Aug. 7, 1989

[51] Int. Cl.[5] .............................. G11C 11/403
[52] U.S. Cl. ................................ 365/154; 357/42
[58] Field of Search ...................... 365/154; 357/42

[56] References Cited

U.S. PATENT DOCUMENTS

| | | | |
|---|---|---|---|
| 3,949,383 | 4/1976 | Askin et al. | 365/154 |
| 3,949,385 | 4/1976 | Sonoda | 365/154 |
| 4,023,149 | 5/1977 | Bormann et al. | 365/154 |
| 4,796,227 | 1/1989 | Lyon et al. | 365/154 |
| 4,839,863 | 6/1989 | Soneda | 365/154 |
| 4,858,195 | 8/1989 | Soneda | 365/154 |

Primary Examiner—Joseph E. Clawson, Jr.
Attorney, Agent, or Firm—Hopgood, Calimafde, Kalil, Blaustein & Judlowe

[57] ABSTRACT

A static RAM cell includes a first pair of transistors, which act as pass or switching transistors during a read or write operation, and as loads during a refresh operation, and a second pair of current sink transistors connected as a cross-coupled flip-flop and connected to the first pair of transistors. The operation of the memory cell transistors during read and write and refresh operations is controlled by different levels of a control signal applied to their respective control terminals, whereby refreshing does not affect reading or writing of data from or into the SRAM cell.

15 Claims, 5 Drawing Sheets

FOUR TRANSISTOR STATIC RAM CELL

TECHNICAL FIELD

The present invention relates generally to memories, and more particularly to a static random-access memory (SRAM).

BACKGROUND OF THE INVENTION

One of the basic units of a microprocessor or similar data-processing computer is the random-access memory or RAM. In a RAM, data is stored at a plurality of address locations as one of two discrete logic levels, a logic 1 or a logic 0. A logic signal can be "read" from any of the address locations by addressing the location from which it is desired to read the stored signal. Also, a new logic signal may be written into any selected address location by the use of a similar addressing operation to select the desired address location into which the new logic signal is to be written to replace a logic signal previously stored at that location.

Two types of RAMs are in common use. One type of RAM is the dynamic RAM or DRAM. In a typical DRAM each address location includes a memory cell consisting of a single MOS transistor and a capacitor connected to the transistor. The absence or presence of a charge on the capacitor represents a stored logic 0 or a stored logic 1, respectively. During a read operation, the charge on the capacitor is distributed through the accessed transistor to the column line to which the cell is connected. The column line is connected to a sense amplifier which typically is also connected to a dummy cell and which produces an amplified signal based on the data signal on the column line. Since the charge on the capacitor will decay over time, it is necessary to periodically refresh the data in DRAM memory cells. To this end, DRAMs employ relatively complex refresh and associated clock circuits.

The other conventional type of RAM is the static RAM or SRAM, in which data is represented by the voltage levels at two data nodes in a flip-flop or latch. The latch is coupled through access transistors to the column or bit lines, which are, in turn, coupled to a sense amplifier. Because the data stored in a latch will not decay no extra refresh circuitry is required in a SRAM. The conventional SRAM cell typically requires at least six MOS transistors, as compared to the one MOS transistor and capacitor commonly employed in a DRAM memory cell.

Because of their respective memory cell arrangements as described, SRAMs and DRAMs have several major advantages and disadvantages with respect to one another. Namely, DRAMs, which require only a single MOS transistor and capacitor to form a memory cell, offer higher density since they require less area, typically one-tenth, to fabricate, and also cost less per bit of stored data as compared to SRAMs. However, because of their need for refreshing, DRAMs must use an external clock and refresh operation. DRAMs thus require many relatively complex peripheral circuits and complex timing circuits and, as a result, typically operate at a lower access time than SRAMs. SRAMs, on the other hand, are easier to use since they do not require the external clock and refresh operation, and have faster access times. Their disadvantages vis-a-vis DRAMs are their lower density and higher cost per bit.

This situation has prevailed for many years. Even with their slower operating speeds, DRAMs, as a result of their greater density and lower costs, are more often used than SRAMs. Thus, in most cases in which a random-access memory is required, SRAMs, even with their inherent higher operating speed, are not chosen by microprocessor designers because of their relatively lower density and higher costs.

Numerous workers in the field of memory design have attempted to realize some of the advantages of DRAMs in an SRAM. Examples of these efforts are described in the following articles: "A 256K CMOS SRAM with Internal Refresh", by S. Hanamura et al.; Proceedings of the 1987 IEEE International Solid-State Circuits Conference, p. 250; "Static RAMs" by Schuster et al., Proceedings of the 1984 IEEE International Solid-State Circuits Conference at p. 226; "A 30-$\mu$A Data Retention Pseudostatic RAM with Virtually Static RAM Mode" by Sawada et al., IEEE Journal of Solid State Circuits, Vol. 23, No. 1, Feb. 1988; "1-Mbit Virtually Static RAM", Nogami et al., IEEE Journal of Solid-State Circuits, vol. sc-21, No. 5, Oct. 1988; and A "288K CMOS Pseudostatic RAM", by Kawamoto et al., IEEE Journal of Solid-State Circuits, Vol. sc-18, No. 5, Oct. 1984.

This situation has generally been found acceptable so long as the microprocessor operated at relatively low speeds. However, recent microprocessor designs, such as the Intel 80386, have created a need for higher-speed memories, particularly as cache memories. In one attempt to satisfy this requirement for higher-speed memories, an SRAM has been employed with a microprocessor as a cache memory in conjunction with a DRAM. The intent of this design was to take advantage of the higher operating speed of the SRAM while also employing the DRAM for its higher density and lower cost. This combined use of an SRAM and DRAM, however, also increases the complexity of the overall system with regard to the addressing and control of the two types of random-access memory employed.

It is accordingly an object of the invention to provide an SRAM memory cell which requires fewer transistors and can thus be fabricated in a smaller area.

It is a more general object of the invention to provide a memory cell for an SRAM which is more comparable to existing DRAMs in density and cost, but which operates at a higher speed than existing DRAMs, thereby allowing the use of the higher-speed SRAM in applications in which lower-cost, higher-density DRAMs have heretofore been used.

SUMMARY OF THE INVENTION

To these ends, the present invention provides a memory cell for an SRAM which requires only four MOS transistors, as compared to the six MOS transistors typically employed in the present state-of-the-art SRAM memory cell. Two of the transistors are connected as a cross-coupled flip-flop and act as current sink transistors. The other two transistors act as load resistors during a data refresh operation and as pass transistors during a read or write operation. The gains of the latter two transistors ar less than those of the current sink transistors. The operation of the cell, in the refresh and read-write modes, is controlled by a different level of a control or word line voltage applied to the control terminals of the two lower-gain transistors.

During a read operation, the current sink transistors are coupled through the pass transistors to the data or bit lines. Depending on the data stored in the cell, the voltages on one of the bit lines will go low with respect to the voltage on the other bit line. That voltage differential is sensed in a sense amplifier, and represents the data at the accessed cell.

During a write operation, in addition to the word line being raised to its higher level, the transistors connected to the bit lines are operated to pull down the voltage on one of the bit lines, depending on whether a logic 1 or 0 is being written into the memory cell.

During a refresh operation, the voltage applied to the word line is at its lower level so that the upper transistors in the memory cell operate as load resistors for the cell rather than pass transistors as during a read or write operation. If there had been some decay of the voltage of the data nodes of the memory cell following a prior refresh, as a result of leakage current, there will be a regeneration or refreshing of the data node voltages to the desired levels for both 1 and 0 logic levels. The size of the transistors coupled to the bit lines is selected so that a writing operation cannot accidentally occur in a cell that is being refreshed.

To the accomplishment of the above and to such further objects as may hereinafter appear, the present invention relates to an SRAM memory cell as defined in the accompanying claims and as described in the following detailed specification, considered with the accompanying drawings, in which:

DETAILED DESCRIPTION OF THE INVENTION

Figure 1:
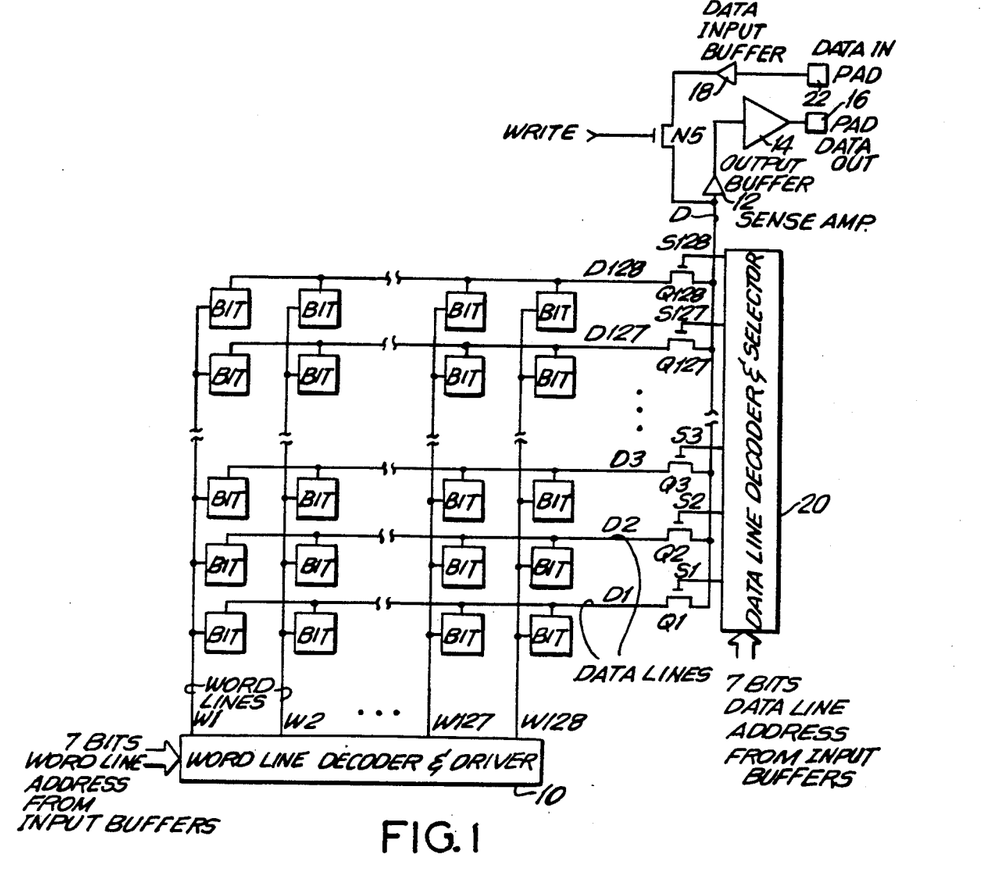
FIG. 1 is a schematic block diagram of a representative memory chip organization.

FIG. 1 illustrates a representational 16K random-access memory of the type in which the SRAM cell of the present invention may be advantageously employed. The memory configuration there shown is, for ease of description, illustrated as being accessible one bit at a time. The memory, for example, could include a different number of memory cells, typically 32K, 64K or higher, and can be rectangular rather than square as shown. It is further to be understood that although the memory schematically illustrated in FIG. 1 may be employed with both DRAMs and EPROMs, it is illustrated here with regard to an improved SRAM, which is the subject of this application.

The memory of FIG. 1 includes a plurality of bits arranged in a 128-row by 128-column matrix, each bit representing one stored bit of binary data at either a logic 1 or logic 0. The word line address signals that are applied to 128 word lines Wn (W1—W128), which address the vertical columns or bits, are produced in a word line decoder and driver 10. The latter operates in response to the logic levels of a 7-bit word-line address applied to its input to produce one of 128 positive-going word line signals corresponding to the column of the selected bit address. Similarly, one of 128 horizontal data lines Dn (D1-D128) is selected by the positive-going one of the 128 outputs, Sn (S1-S128) produced by data line decoder and selector 20. Data select transistors Qn (Q1-Q128) are respectively connected between a common data line D and the 128 row lines of the memory. The gates of transistors Q1-Q128 are respectively coupled to the outputs of data line selector 20. The positive going Sn signal turns on its associated NMOS data selection transistor Qn. Only one of data lines D1-D128 is selected; that is, only one output decode Sn signal goes positive at any one time in accordance with the 7-bit data line address applied to the input of decoder 20.

The selected or positive word line Wn and data line Dn signals establish the address, i.e., row and column of the selected bit, which is located at the intersection of the selected vertical word line and horizontal data line. Although the data lines Dn in FIG. 1 are illustrated as single lines for the sake of simplicity, it is common to have a pair of complementary data lines going to each bit. In such a configuration, a pair of NMOS data selection transistors would be included for each data line rather than the single data transistor shown in the memory of FIG.1.

The addressed data bit is connected to the common line D, which is connected to the input of a sense amplifier 12. The output of the sense amplifier is applied to the input of an output buffer 14, the output of which is connected to a Data Out pad 16. The common data line D is also connected to the source of an NMOS write transistor N5, the drain of which is connected to the output of a data input buffer 18. The input of buffer 18 is connected to a Data In pad 22. The gate of transistor N5 receives the Write signal.

During the performance of a read operation in the memory of FIG. 1, one word line Wn is driven high, one of the NMOS data selection transistors Qn is selected, i.e., turned on, and the data stored in the selected bit is applied to the sense amplifier 12, from which the read data is passed through the output buffer 14 to drive a typically large external capacitance.

During a write operation, one word line Wn corresponding to the column or bit into which the new data is to be written, is driven high, transistor N5 is turned on by a Write signal, which goes high, and one of the selected pass transistors Qn, for the row of the bit into which the new data is to be written, is turned on. Data from the input buffer 18 is then passed through transistor N5 and the selected pass transistor Qn to the selected bit, thereby to drive the selected bit with a strong logic 1 or 0 signal.

Figure 2:
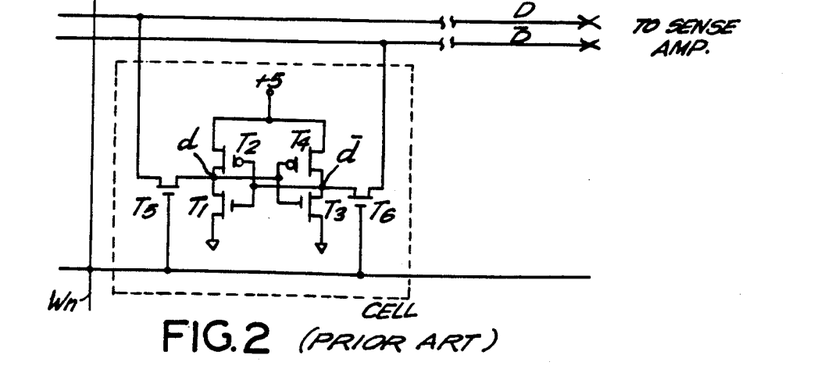
FIG. 2 is a schematic circuit diagram of a conventional SRAM memory cell.

As noted, each of the bits in the memory of FIG. 1 may be an SRAM or a DRAM. A typical prior art SRAM, as illustrated in FIG. 2, consists of six MOS transistors, two NMOS pull-down transistors T1 and T3, two PMOS pull-up transistors T2 and T4, and two NMOS access transistors T5 and T6. As shown in FIG. 2, the gates of transistors T1 and T2 are connected together as are the gates of transistors T3 and T4. The sources of transistors T2 and T4 are connected to a positive voltage supply such as +5 volts, and their drains are respectively connected to the sources of transistors T1 and T3 and to the gate of the other PMOS transistor. The sources of transistors T1 and T3 are connected to ground.

Complementary data-storing nodes d and $\bar{d}$ are established at the common connections of the drains of NMOS transistor T3 and PMOS transistor T4, and NMOS transistor N1 and PMOS transistor T2 respectively. These data nodes are also coupled respectively to the drains of the two NMOS access transistors T5 and T6. The gates of transistors T5 and T6 are connected to a word line Wn and their sources are connected respectively to the balanced data or bit lines D and $\bar{D}$, which are coupled through data selection transistors to the inputs of a sense amplifier (not shown in FIG. 2). Because of its need for the six MOS devices, as compared to a DRAM cell, which requires only a single MOS device and a capacitor, the conventional SRAM, as illustrated in FIG. 2, requires greater area and can thus not be nearly as dense as a DRAM. It is the purpose of this invention to provide an SRAM cell that requires fewer MOS devices, and which can thus be fabricated at a greater density that is more comparable to that of a DRAM.

Figure 3:
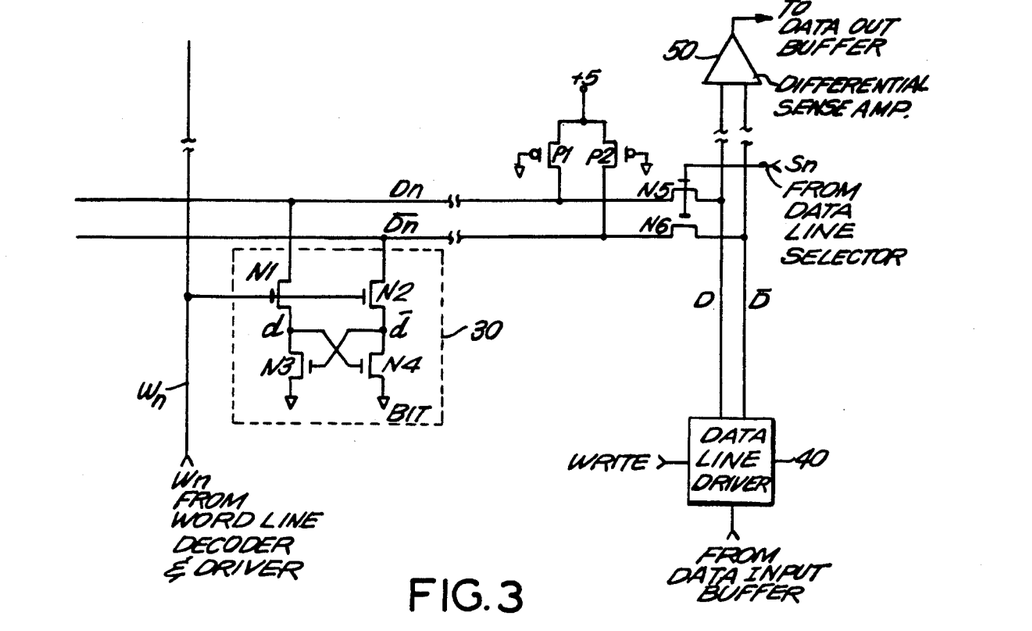
FIG. 3 is a schematic circuit diagram of an SRAM memory cell in accordance with an embodiment of the present invention.

To this end, as shown in FIG. 3, the SRAM cell 30 of the illustrative embodiment of the invention shown therein is in the form of a cross-coupled flip-flop or latch made of four NMOS transistors N1, N2, N3 and N4. More specifically, as illustrated in FIG. 3, the drains of transistors N1 and N2 are respectively connected to the gates of transistors N4 and N3, and their sources are respectively connected to the complementary data lines Dn and $\overline{Dn}$. The drains of transistors N3 and N4 are also respectively connected to the sources of transistors N1 and N2, and the sources of transistors N3 and N4 are both connected to ground. The gates of transistors N1 and N2 are each connected to the word line W that receives the word line signal Wn from the word line decoder and drive (10 in FIG. 1). The data stored in the cell is represented by the signal at node d, and its logic complement at node $\bar{d}$.

The data lines Dn and $\overline{Dn}$ are respectively connected through the source-drain circuits of signal pass NMOS devices N5 and N6 to data lines D and $\bar{D}$. The gates of devices N5 and N6 each receive the data line select signal Sn from the data line selector (20 in FIG. 1). The column lines Dn and $\overline{Dn}$ are also connected to the drains of PMOS transistors P1 and P2, respectively. The sources of transistors P1 and P2 are each connected to a +5 v supply and their gates are each grounded so that they are always on.

The width-to-length ratio (W/L) of transistors N1 and N2 in the SRAM cell of FIG. 3 are preferably the same and preferably in the order of one-fifth of that of transistors N3 and N4, which are also preferably the same. As a result of this relative dimension of these transistors, the on resistance of transistors N1 and N2 is preferably in the order of five times greater than that of transistors N3 and N4. Thus, when the word line signal is high, transistors N1 and N2 are turned on, so bit or cell 30 can be considered as a cross-coupled flip-flop in which transistors N1 and N2 are load resistors to the positive potentials on data lines Dn and $\overline{Dn}$.

The data lines D and $\bar{D}$ are coupled to the output of a data line driver 40 and also to the input of a differential sense amplifier 50. The data line driver 40 receives an input from a data input buffer (18 in FIG. 1) and the Write signal. The output of the sense amplifier 50 is applied to a data out buffer (14 in FIG. 1).

Advantageously, the W/L ratio of transistors P1 and P2 is selected so that the resistance of each, when they are turned on, is lower than the on resistance of the series connected transistors N1 and N3 and transistors N2 and N4. Thus, even if a bit is turned on when its word line Wn goes positive (high), the data lines Dn and $\overline{Dn}$ cannot be pulled very low, preferably no more than 2 volts below 5 volts because of their connection through transistors P1 and P2 to +5 volts. PMOS transistors P1 and P2 are turned on at all times and serve to pull data lines Dn and $\overline{Dn}$ to +5 volts if the bit is not accessed or addressed by its word line Wn going high.

When the cell 30 is not being accessed (in actual memory operation a cell is usually not being accessed) the word line Wn is at 0 volts and transistors N1 and N2 are turned off. Whether a 0 or a 1 logic signal is stored in the cell is determined by the voltage values at nodes d and $\bar{d}$. Assuming, for example, that a 1 is stored if node d is at a high voltage in excess of an NMOS transistor threshold voltage, Vtn, and node $\bar{d}$ is at 0 volts; and that a 0 is stored if node $\bar{d}$ is high and node d is at 0 volts. With word line Wn low, either of these two conditions would be stable except for leakage current, because if either node d or $\bar{d}$ is high and the other is low, then only drain leakage can discharge the high voltage node, and the lower-voltage node is already fully discharged to 0 volts. Because of the loss caused by this leakage, the SRAM cell 30 must be periodically refreshed to retain stored data. The present invention provides for such refreshing of the cell in a manner described at a later part of this specification.

The operation of the SRAM cell of the invention, as illustrated in the embodiment of FIG. 3, can now be described with regard to the manner in which a read, refresh, and write operation are performed, with reference to the wave form diagrams of FIGS. 4 and 5.

READ OPERATION

In a read operation, the word line signal Wn (FIG. 4) is pulsed from 0 volts to +5 volts. If, for example, a 1 had been stored on data node d (a positive voltage greater than the threshold voltage (Vtn) of NMOS device N3), and a 0 is stored on node d (0 volts), then, as shown in FIG. 4, the voltage on data line Dn will try to go low and data line $\overline{Dn}$ will stay at +5 volts (FIG. 4). The signals on data lines Dn and $\overline{Dn}$ from one row will be selected by the data line selector 20 and passed to differential sense amplifier 50, which amplifies the difference between date lines Dn and $\overline{Dn}$ to a full logic swing. For example, if the voltage on data line Dn is less than that on data line $\overline{Dn}$, the output of the sense amplifier 50 would be 0 volts, and if the voltage on data line $\overline{Dn}$ were less than on data line Dn, then the output of the sense amplifier would be +5 volts. Although nodes d and $\bar{d}$ are shown in FIG. 4 as changing during reading, the signal at node d is equal to 0 volts before and after reading, even though it has some noise during reading, and that the signal at node $\bar{d}$ is more positive than Vtn before and after reading even though there is a permanent boost in the amplitude of the signal at node $\bar{d}$.

REFRESH OPERATION

Figure 4:
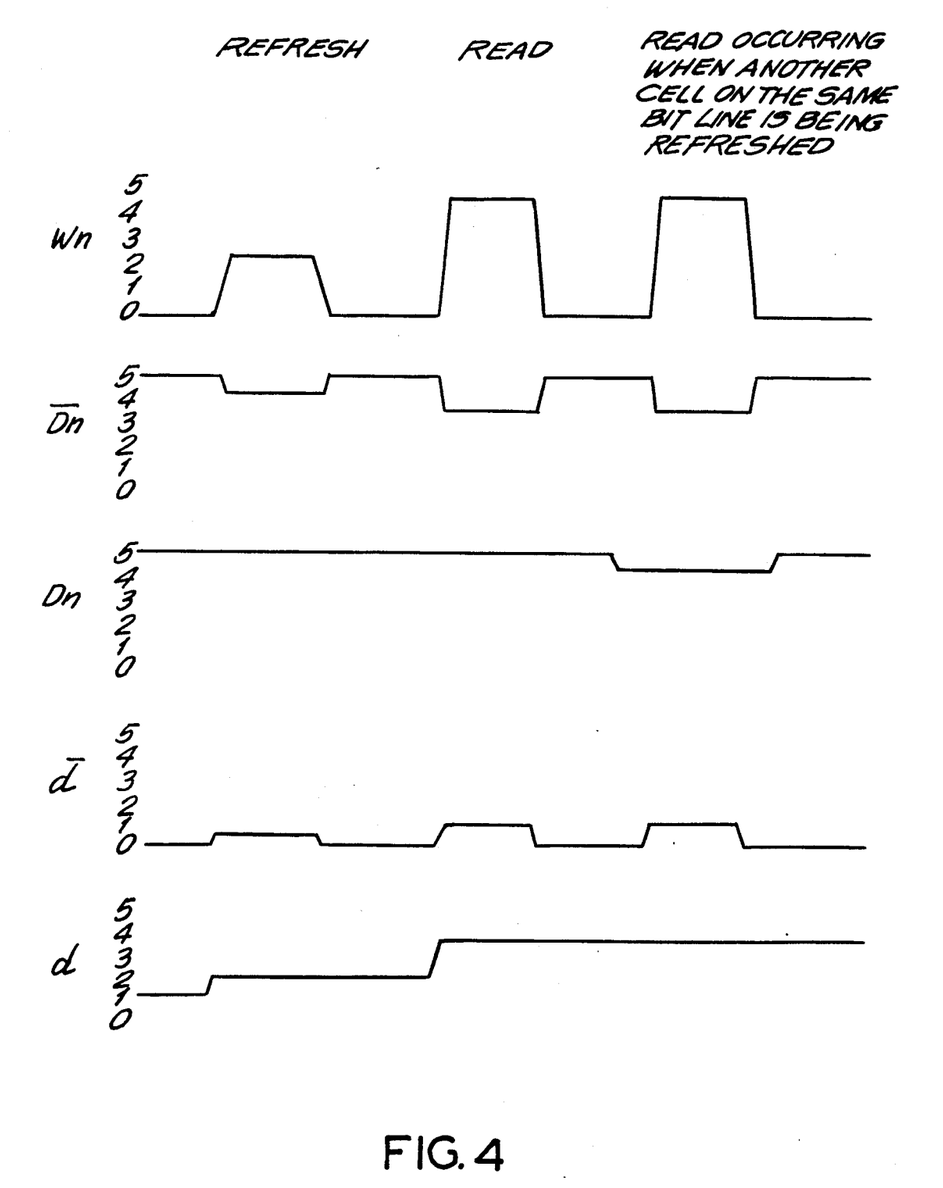
FIG. 4 illustrates wave forms of signals employed during refresh and read operations on the memory cell of FIG. 3.

In a refresh operation, as shown in FIG. 4, the word line Wn is pulsed to only about +2.5 volts rather than +5 volts. The circuit for providing the different word line levels for reading and refresh operations is described later in this specification with reference to FIG. 6. Before this refresh pulse occurs, node d is at 0 volts, and node $\bar{d}$ has leaked down to slightly over 1 volt. The refresh pulse on word line Wn turns on transistors N1 and N2 as load resistors, making the cell into a cross-coupled flip-flop, which pulls node $\bar{d}$ higher, close to 2 volts. Because of the reduced amplitude of word-line Wn, transistors N1 and N2 will not turn on to as low a resistance as they did during reading, and the voltage on data line Dn will not pull as low. As shown in FIG. 3, when one SRAM cell on the same bit line is being read while another SRAM cell is being refreshed, the same data lines Dn and $\overline{Dn}$ are used as are used in a read operation. FIG. 4 shows the wave forms that are employed in the operation of the memory cell of FIG. 3 and its associated circuitry when the data stored in the cell being refreshed is opposite to that in the cell from which data is then being read, the worse case condition. As seen in the right side of FIG. 4, in this case, the signal on data line Dn is still less than that on data line $\overline{Dn}$ so that the correct differential between these data lines is applied to the input of the sense amplifier, thereby to produce a correct signal at the output of the sense amplifier.

It will thus be appreciated that a refresh operation has no discernible effect on a read operation, or stated differently, data refreshing is transparent to reading in the SRAM cell of this invention. It is also to be understood that at any given time, only one other cell is being refreshed using the same data lines Dn and $\overline{Dn}$ as a cell that is then being read. As a consequence of this, the effect and refreshing on a read operation will never be greater than that just described and as illustrated in the wave forms of FIG. 4.

WRITE OPERATION

Figure 5:
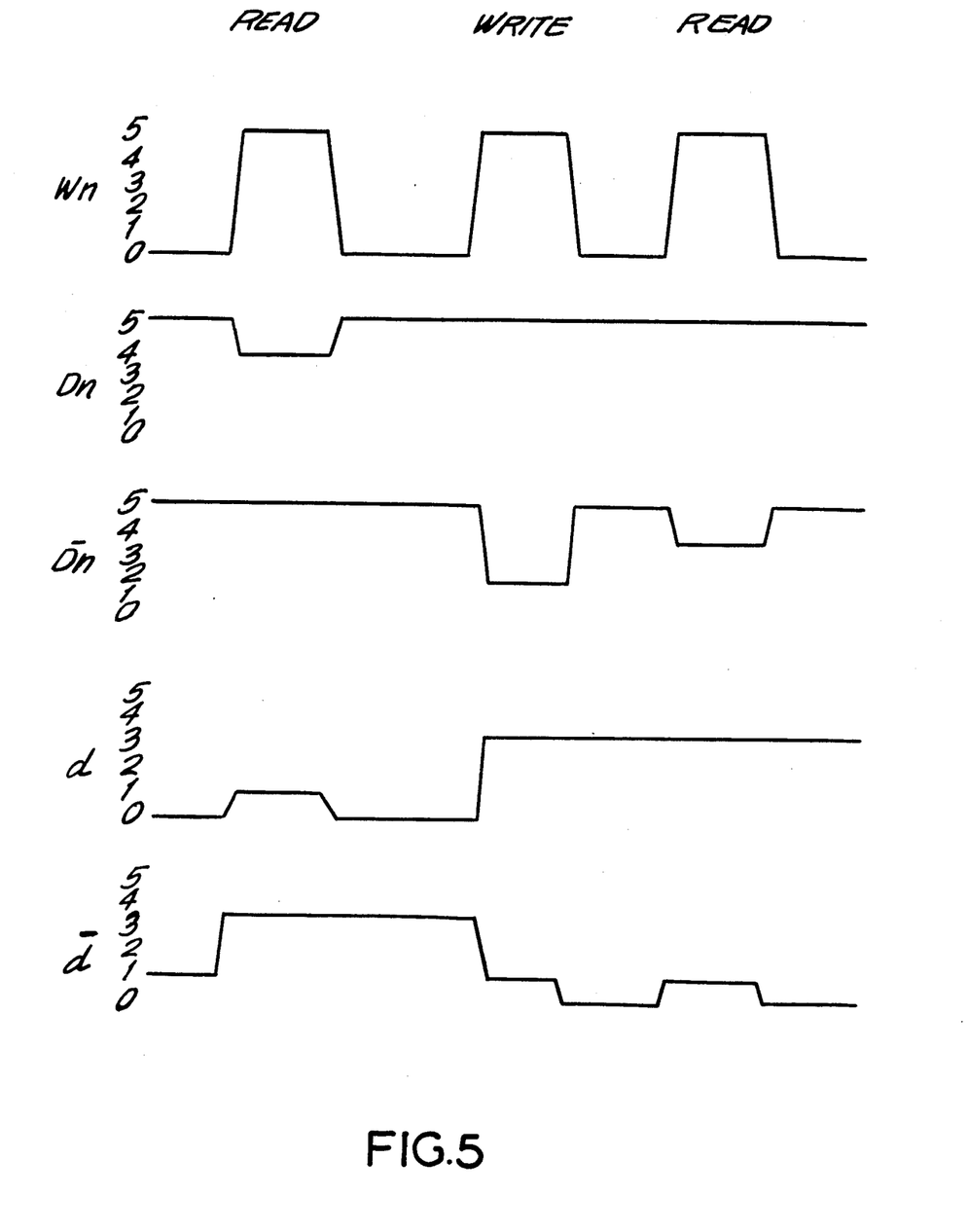
FIG. 5 illustrates wave forms of signals employed during a write operation on the memory cell of FIG. 3.

In a write operation, as shown in FIG. 5, the word line signal Wn is pulsed to a full +5 volts. At the same time the data line driver 40 forces common data line D or $\overline{D}$ low. For example, line D is low if a 0 is to be written, and line $\overline{D}$ is low if a 1 is to be written. The low driven data line D or $\overline{D}$ communicates to a selected date line Dn or $\overline{Dn}$ through devices N5 and N6, respectively, forcing data line Dn or $\overline{Dn}$ low. The series resistance of transistor N5 or N6 and the data line driver output resistance must be low enough to force data lines Dn or $\overline{Dn}$ low against transistors P1 and P2 that are trying to hold the data lines high. FIG. 5 shows the condition of the signal used where node d is initially 0 volts and node $\bar{d}$ is high, which produces the readout signal shown in FIG. 5. During a write operation, data line $\overline{Dn}$ is forced low in order to write 0 onto node $\bar{d}$ and data line Dn is left high to write a 1 onto node d, thereby changing the state of the bit. After the state of the bit is thus changed, a subsequent read operation on the cell will indicate a reversal of the signals on data lines Dn and $\overline{Dn}$.

As shown in FIG. 5, data line $\overline{Dn}$ is forced down to only about 2 volts, not to 0 volts, which means that if another cell is being refreshed at the same time on the same data lines Dn and $\overline{Dn}$, the gate-to-source voltages on transistors N1 and N2 will not be high enough to turn those transistors on to allow writing in that cell. The gate-to-source voltage will be 2.5 volts less 2.0 volts or 0.5 volts. It will thus be understood that refreshing is also transparent to writing; that is, writing a new data level into the cell cannot be performed during refreshing of the cell; it does not adversely affect refreshing.

Having described the organization and manner of operation of the novel SRAM cell of the invention, preferred embodiments of circuits that can be employed to advantage in implementing the operation of the memory cell are now described with reference to FIGS. 6–9.

Figure 6:
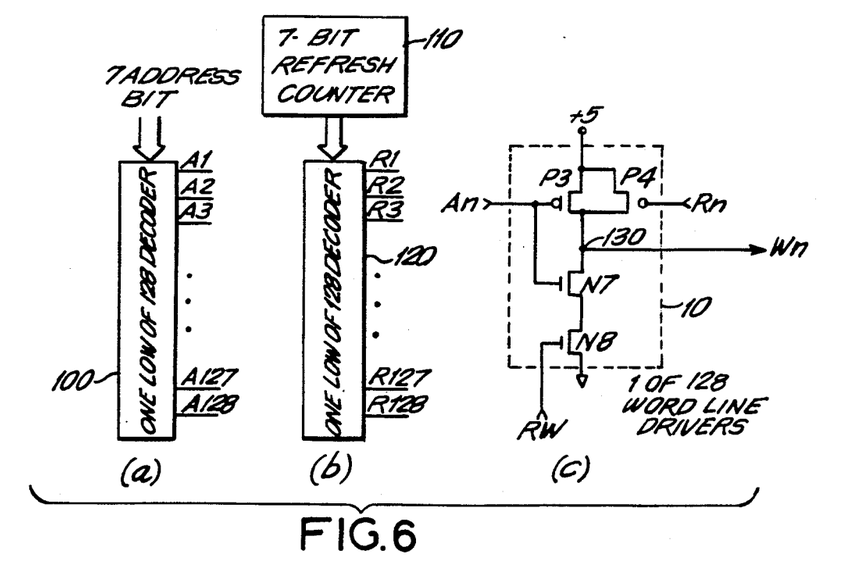
FIGS. 6(a)-(c) schematically illustrate word line address and refresh decoders and a word line driver circuit that may be used in implementing the read-write and refresh operations on the SRAM cell of the invention.

Referring first to FIG. 6, there is shown the word line decoders (FIGS. 6a and 6b) which respectively provide address and refresh control signals to a word line driver 10 (FIG. 6c). For a 16K SRAM, as described here for purposes of example, the seven address bits on seven address lines are applied to an address decoder 100, which, depending on the logic levels of the seven address bits, selects one of its output address lines An (A1-A128) to go low (e.g. 0 volts), while the other 127 address lines remain high (e.g., +5 volts).

For a refresh operation, seven refresh bits are cycled or circulated through a 7-bit refresh counter 110, which sequentially produces or cycles a 7-bit output through all of its 128 possible logic combinations. The 7-bit output from refresh counter 110 is applied to a 128-bit decoder 120, which, depending on the logic levels of the seven refresh bits then applied to its input from refresh counter 110, selects one of its 128 bits Rn (R1 R128) to go low, e.g., zero volts, while the remaining unselected bits remain high (e.g., +5 volts).

The selected address and refresh signals An and Rn are both applied to a word line driver circuit such as circuit 10 illustrated in FIG. 6c, it being understood that one such circuit is provided for each of the 128 columns of a 16K SRAM. As shown in FIG. 6(c), the word line driver circuit includes two PMOS transistors P3 and P4, whose sources are connected in common to a +5 supply voltage. The gate of transistor P3 receives the address signal An from the decoder of FIG. 6a, and the gate of transistor P4 receives the refresh signal Rn from the decoder of FIG. 6b.

The drains of transistors P3 and P4 are also connected in common to an output node 130 at which the word line signal Wn is produced. Node 130 is also connected to the source of an NMOS transistor N7 whose gate also receives the address signal An. The drain of NMOS transistors N7 is connected to the source of another NMOS transistor N8 whose drain is connected to ground. The gate of transistor N8 receives a DC reference voltage RW at approximately 2.5v that is supplied to each of the 128 word drivers from a reference generator described below with reference to FIG. 7.

When a word line driver circuit receives a selected (low or 0 volt) address signal An and a high (+5 volt) reference signal RW, transistor P3 is turned on, transistors P4 and N7 are off, and transistor N8 is on. The signal Wn at node 130 thus is connected through the source-drain of transistor P3 and goes high to +5 volts. This operation occurs for a read operation and for a write operation.

For a refresh operation, the selected refresh signal Rn, as discussed above, will be low, or 0 volts. The low Rn signal will turn transistor P4 on, whereas the unselected high An signal (+5 volts) at the gate of transistor N7 will turn that device on. In this condition, the resistance of the on devices, transistors P4 and transistors N7 and N8 in series between the +5 volt supply and ground, form a voltage divider. As a result, in a refresh operation, the word line signal Wn at node 130 does not go to +5 volts, but rather, because of the operation of this voltage divider, will only rise to about 2 to 2.5 volts.

Figure 7:
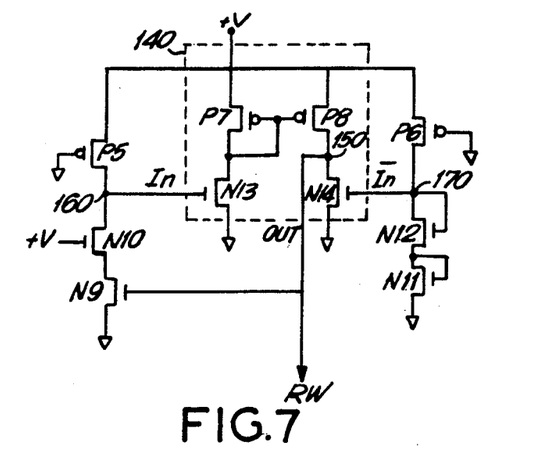
FIG. 7 is a schematic of an embodiment of a word line reference generator that may be used in implementing the SRAM cell of the invention.

The reference generator circuit shown in FIG. 7 generates the reference signal RW employed in the operation of the word line driver circuit of FIG. 6(c). As shown in FIG. 7, a CMOS differential amplifier 140 is included in the box outlined by the broken lines. Differential amplifier 140 includes two branches, one including PMOS transistor P7 and NMOS transistor N13, and another including PMOS transistor P8 and NMOS transistor N14. The gates of transistors P7 and P8 are connected in common and to the source of transistor N13. The drains of transistors N13 and N14 are connected to ground, and the sources of transistor P7 and P8 are connected to +V supply. The source of transistor N14 is connected to the drain of transistor P8 and to an output node 150.

Differential amplifier 140 receives complementary inputs In and $\overline{In}$ and produces the reference RW signal at its output node 150, which is in phase with the input In and out of phase with input $\overline{In}$. Input In is obtained at a node 160 established at the common connection of the drain of PMOS transistor P5 and the drain of NMOS transistor N10. The source of transistor P5 is connected to a +V supply line. The gate of transistor P5 is connected to ground, the gate of transistor N10 receives the +V supply voltage, and its source is connected to the source of NMOS transistor N9. The drain of transistor N9 is connected to ground and its gate is connected to the output node 150.

Similarly, the complementary input $\overline{In}$ is produced at a node 170 formed at the common connection between the drains of a PMOS transistor P6 and an NMOS transistor N12. The source of transistor P6 is connected to the +V line and its gate is connected to ground. The source of transistor N12 is connected to both the drain and the gate of an NMOS transistor N11 whose source is connected to ground. The input $\overline{In}$ at node 170 is tied to a reference voltage derived from the voltage divider consisting of transistors P6, N12 and N11. The W/L ratios of transistors N11 and N12 are high as compared to that of the transistor P6 so that the voltage level of input $\overline{In}$ is higher than two NMOS threshold voltages, or typically between 2.0 and 2.5 volts.

The input In is derived at node 150 from the voltage divider consisting of PMOS transistor P5 and NMOS transistor N10 and N9. That voltage divider advantageously closely matches the portion of the word line driver (FIG. 6(c)) consisting of transistors P4, N7 and N8. In the circuit of FIG. 7, transistor P5 is advantageously identical to transistor P4 in the circuit of FIG. 6(c) and is always turned on. Similarly, transistor N9 in the FIG. 7 circuit is advantageously identical to transistor N8 in the FIG. 6(c) circuit, and transistor N10 in FIG. 3 is advantageously identical to transistor N7 in the circuit of FIG. 6(c). Transistor N10 is always conductive, i.e., turned on, as a result of its gate being connected to the +V supply.

In the operation of the circuit of FIG. 7, the output of the differential amplifier 140, the reference signal RW at output node 150, is pulled through a negative feedback path (transistors N9, N10 and P5) to the input node 160 at which the input In is applied. The differential amplifier 140 attempts to vary its output signal to make its two inputs In and $\overline{In}$ equal, but since the gain of the differential amplifier 140 is not very high, the levels of the inputs In and $\overline{In}$ will not be exactly equal but they will be sufficiently close.

This output voltage, which is the reference signal RW applied to the gate of transistor N8 in the world line driver circuit of FIG. 6(c), is at an appropriate level to ensure that when the reference signal Rw is applied to the gate of transistor P4 in the circuit of FIG. 6(c), the output of that circuit, the world line Wn, will be, as desired, between 2 and 2.5 volts. The circuit of FIG. 7, which generates the reference voltage RW, will thus track, and is independent of, variations in any NMOS or PMOS transistor in the circuit which may occur as a result, for example, of process variations or variations in supply voltage or temperature. The result of this circuit arrangement is that the level of the word line Wn during refresh (when Rn is low) will always be slightly greater than two NMOS threshold voltages, as desired.

Figure 8:
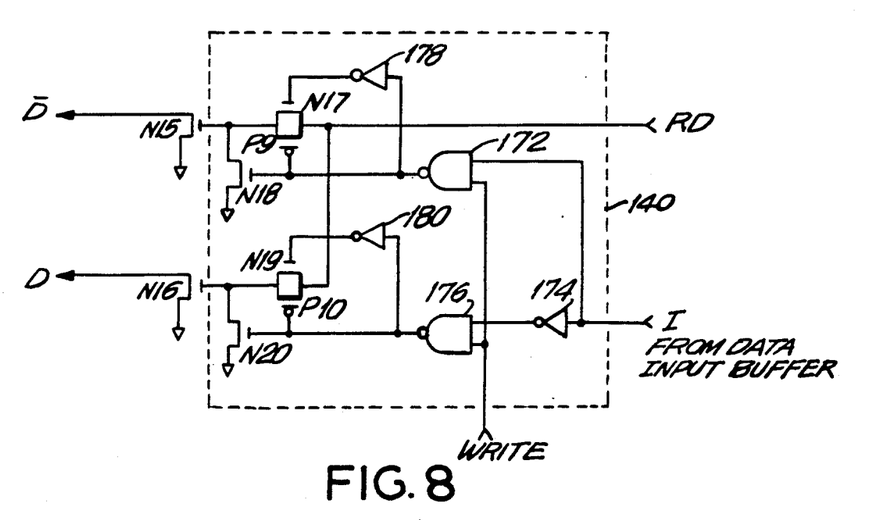
FIG. 8 is a schematic of an embodiment of a data line driver that may be used in implementing the SRAM cell of the invention.

The data line driver circuit 40 (FIG. 1) that generates the two complementary signals on complementary data lines D and $\overline{D}$ employed in the operation of the SRAM cell of FIG. 3 is illustrated in FIG. 8. As therein shown, the circuit receives an input reference voltage RD applied to the common source-drain circuits of transistors P9, N17 and P10, N19. Another input to the circuit, the input data signal I, is applied to one input of a NAND gate 172 and through an inverter 174 to one input of a second NAND gate 176. The Write signal is applied to the other inputs of NAND gate 172 and 176.

The output of gate 172 is applied to the gates of PMOS transistor P9 and an NMOS transistor N18 and through an inverter 178 to the gate of NMOS transistor N17. The output of gate 176 is applied to the gates of PMOS transistors P10 and an NMOS transistor N20, and through an inverter 180 to the gate of NMOS transistor N19.

The source of transistor N18 is connected to the common source-drain connection of transistors P9, N17 and to the gate of an output NMOS transistor N15. The drain of transistor N18 is connected to ground. Similarly, the drain of transistor N20 is connected to the source-drain connection of transistors P10, N19 and to the gate of output NMOS transistor N16. The sources of transistors N15 and N16 are connected to ground and their drains respectively provide the output D and $\overline{D}$ data line signals.

In the operation of the circuit of FIG. 8, when the Write signal is low, the signal at the gates of transistors N15 and N16 are both low (0 volts). When the Write and I signals are both high, the reference voltage RD is applied to the gate of transistor N15 and 0 volts is applied to the gate of transistor N16. When the Write signal is high and the I signal is low, then the reference voltage RD is applied to the gate of transistor N16 and 0 volts is applied to the gate of transistor N15. When either transistor N15 or N16 is made conductive by the application of the RD reference to its gate, they are turned on to a controlled resistance, which is sufficient to ensure that the data lines D and $\overline{D}$, and thus data lines Dn and $\overline{Dn}$ (FIG. 3), as the case may be, are not pulled to 0 volts but only to about 1.5 to 2.0 volts.

Figure 9:
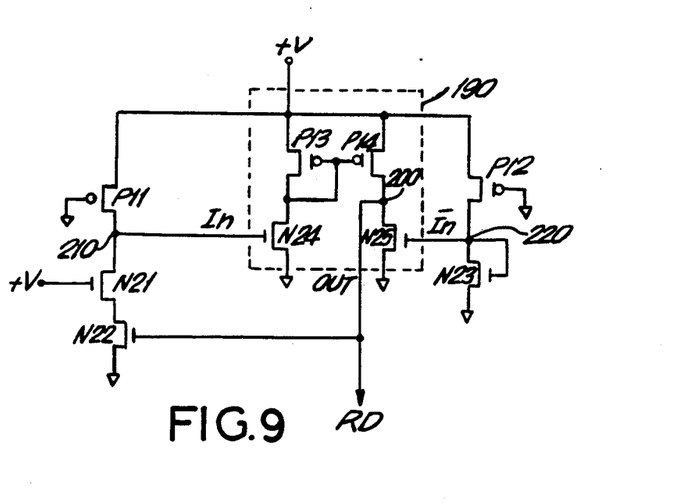
FIG. 9 is a schematic of an embodiment of a data line reference generator that may be used in implementing the SRAM cell of the invention.

FIG. 9 illustrates a circuit for generating the reference voltage RD employed in the data line driver circuit of FIG. 8. As shown, the circuit of FIG. 9 includes a differential amplifier 190, within the box formed by the broken lines. Amplifier 190 comprises one branch including a PMOS transistor P13 and an NMOS transistor N24, and a second branch which includes a PMOS transistor P14 and an NMOS transistor N25. The reference voltage RD is produced at an output node 200 of the common connection of the drains of transistors P14 and N25.

An In signal is derived at a node 210 from a voltage divider that includes a PMOS transistor P11 and NMOS transistors N21 and N22 connected in series between the +V supply line and ground. The gate of transistor P11 is grounded, the gate of transistor 21 receives the +V supply voltage and is thus always on, and the gate of transistor N22 is connected to node 200 to receive the output RD of the differential amplifier. Similarly, the $\overline{In}$ signal is derived at a node 220 of a voltage divider including a PMOS transistor P12 and an NMOS transistor N23 connected between the +V supply line and ground.

The size of transistor P11 is the same as that of transistors P1 and P2 (FIG. 3), the size of transistor N21 is the same as that of transistors N5 and N6 (FIG. 3), and the size of transistor N22 is the same as that of transistors N15 and N16 (FIG. 8). In addition, the W/L ratio of transistor N23 is greater than that of transistor P12 so that the $\overline{In}$ signal is typically 1.5 volts, which is slightly above one NMOS threshold voltage.

In the operation of the circuit of FIG. 9, the differential amplifier 190 tries to adjust its output, the reference drive signal RD, such that the levels of signals In and $\overline{In}$ become equal. As a result, the level of the reference drive signal RD tracks all variations in processing and operating parameters to automatically generate a reference signal of about 1.5 volts.

It will be appreciated that an SRAM cell that requires only four MOS transistors, in contrast to the standard or typical SRAM cell which requires 6 MOS devices, has been described herein as including all NMOS transistors, this is not required in the implementation of the invention, although the four MOS transistors that constitute the novel SRAM cell of the invention are preferably of the same conductivity type. It will further be understood that the control and address circuits described for operating the SRAM cell, as well as circuit details of the SRAM cell, may also be modified without necessarily departing from the spirit and scope of the invention.

What is claimed is:

1. In a read-write memory including a word line and complementary data lines and a memory cell, said memory cell comprising complementary data nodes for storing data signals at one of two levels thereat, the data signals on said data nodes requiring periodic refreshing to retain their desired values, said memory cell including first and second MOS transistors each having one output terminal respectively connected to one of said data lines, a second output terminal connected respectively to said data nodes and a control terminal connected to said word line, and third and fourth MOS transistors each having one output terminal connected respectively to one of said data nodes and a control terminal connected respectively to the other of said data nodes, said memory further comprising means for applying a first control signal at a first level to said word line during a read or write operation and for applying a second control signal to the word line at a level lower than that of said first control signal during a refresh operation, said lower level signal turning on said first and second transistors to a higher on resistance than said higher-level first control signal, said control signal applying means including an address decoder for providing an address signal and a refresh counter for providing a refresh signal and a word line driver having first and second inputs respectively receiving said address signal and said refresh signal and effective to produce said first control signal when it receives said address signal and said second control signal when it receives said refresh signal.

2. In the memory of claim 1, in which the resistances of said first and second MOS transistors are substantially equal, and the resistances of said third and fourth MOS transistors are substantially equal at the same operating voltages.

3. In the memory of claim 1, in which the resistances of said first and second MOS transistors are greater than those of said third and fourth MOS transistors at the same operating voltages.

4. In the memory of claim 3, in which the resistance of said first and second transistors is five times greater than that of said third and fourth transistors.

5. In the memory of claim 4, further comprising fifth and sixth transistors having an output terminal respectively connected to one of said data lines.

6. In the memory of claim 5, in which the resistances of said fifth and sixth transistors are respectively less than the combined series resistances of said first and third transistors and said second and fourth transistors, respectively.

7. In the memory of claim 6, in which said first, second, third and fourth transistors are all of a first conductivity type.

8. In the memory of claim 7, in which said fifth and sixth transistors are each of a second conductivity type.

9. In the memory of claim 8, in which said first, second, third, and fourth transistors are NMOS transistors, and said fifth and sixth transistors are PMOS transistors.

10. In the memory of claim 1, further comprising fifth and sixth transistors each having an output terminal respectively connected to one of said data lines.

11. In the memory of claim 5, in which the resistances of said fifth and sixth transistors are respectively less than the combined series resistances of said first and third transistors and said second and fourth transistors, respectively.

12. In the memory of claim 1, in which said first, second, third and fourth transistors are all of a first conductivity type.

13. In the memory of claim 2, in which said fifth and sixth transistors are each of a second conductivity type.

14. In the memory of claim 3, in which said first, second, third, and fourth transistors are NMOS transistors, and said fifth and sixth transistors are PMOS transistors.

15. A read-write memory including word lines and orthogonal complementary data line pairs servicing an array of first, second, third and fourth transistor memory cell, each of said memory cells comprising two complementary data nodes for storing data signals at one of two levels, the data signals on said nodes requiring periodic refreshing to retain their desired values, said memory cell further including first and second MOS transistors having their drains connected to said data line pair, their sources connected to said data nodes and their gates commonly connected to said word line, and third and fourth MOS transistors each having sources connected to ground, drains connected to said data nodes, and gates cross-connected to each other's drains, the resistances of said first and second MOS transistors being essentially the same and at least four times greater than the essentially equal resistances of said third and fourth transistors at essentially the same operating voltages; means for setting a word line to a cell to a maximum positive supply voltage during a read or write operation, to approximately half of the supply during a refresh operation, and to essentially zero volts in the absence of a refreshing, reading or writing operation; and means for enabling the sequential turning on, one at a time, of word lines for refreshing, thereby having on at any one time a maximum of two word lines, said word line voltage setting means including means for placing one of said word lines at a half level for refreshing, and the other of said one word lines at a full level for reading or writing, and for placing one of said word lines on at a half level if neither reading nor writing is occuring, thereby reducing memory power consumption.

* * * * *